MOUNTING AND CONNECTING MEANS FOR CIRCUIT DEVICES

Filed Feb. 21, 1966

2 Sheets-Sheet 1

Oct. 3, 1967 R. F. COBAUGH ET AL 3,345,541

MOUNTING AND CONNECTING MEANS FOR CIRCUIT DEVICES

Filed Feb. 21, 1966

2 Sheets-Sheet 2

3,345,541

MOUNTING AND CONNECTING MEANS FOR CIRCUIT DEVICES

Robert Franklin Cobaugh, Hershey, and Mark Allen Shrock, Mechanicsburg, Pa., assignors to AMP Incorporated, Harrisburg, Pa.

Filed Feb. 21, 1966, Ser. No. 528,998
4 Claims. (Cl. 317—101)

This invention relates to an improved mounting and connecting means for small circuit devices such as integrated circuit devices.

An object of the invention is to provide a means for packaging and mounting integrated circuit devices or the like. A further object is to provide a circuit device mounting means which affords a high degree of protection to the circuit device and its leads during testing, shipment, and assembly. A further object is to provide a circuit device mounting means which functions as an electrical connector part and which is cooperable with a mating connector to connect the circuit device to further circuitry.

These and other objects of the invention are achieved in a preferred embodiment comprising a relatively flat mounting block or support of insulating material on one face of which the integrated circuit device is mounted. The leads on the sides of the circuit device extend to the edges of the mounting block and extend over the opposite side of the block to the opposite face. The completed mounting and circuit device combination is thus arranged with the circuit device leads on one side of the mounting block so that the support can be used with a further connecting device to connect the leads to external circuitry. In accordance with our preferred embodiment, this further connecting device comprises an electrical connector having a recess on one side for reception of the circuit device mounting block. Electrical contacts of any suitable type are mounted in the connector on opposite sides of this recess so that when the mounting block having the circuit device thereon is positioned in the connector block, the leads from the circuit device will make contact with electrical contacts in the connector block. The contacts in the block extend through the connector block normally of the plane of the circuit device and from the opposite side of the block. Each contact device in accordance with one embodiment includes a post portion on the opposite side which extends through the mounting panel on which the block is mounted and thereby affords a means for making suitable interconnections between a plurality of circuit devices.

A typical form of integrated circuit device or "flat pack" 2 comprises a rectangular chip with leads 4, 6 extending from its opposite sides. The end leads 8, 10 on each side extend from the ends 11, 13 of the flat pack but are directed laterally so that they will be parallel to the other leads 4, 6. Integrated circuit devices are quite small, the chips 2 being about one-quarter inch or less on a side and the leads 4, 6, 8, 10 being relatively thin ribbons with a width of about 0.040 inch. In use, these leads are suitably connected to further conductors which interconnect the leads of the flat packs. Because of the extremely small size of the flat pack and the leads, the termination and interconnection problems presented do not lend themselves to previously known termination and interconnection techniques.

Figure 1:
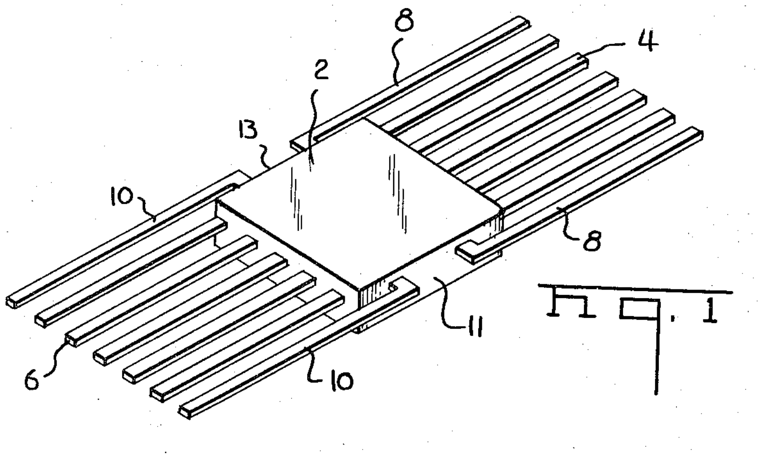
FIGURE 1 is a perspective view of a typical integrated circuit device or flat pack.

It should be added that prior to being incorporated into a circuit, it is desirable to test the individual flat packs 2 and to this end, a testing apparatus must be temporarily connected to the individual leads of the flat pack. In general, it can be stated that flat packs of the type shown in FIGURE 1 present handling and connecting problems which cannot be solved by presently available handling and connecting techniques.

In accordance with one embodiment of our invention, we provide a support block 12 of suitable insulating material, such as nylon, in the form of a generally rectangular base member having a recess 14 on its upper face which is adapted to receive the chip 2. The sides 15, 17 of the support are provided with spaced apart slots 16, 18, the widths and spacings of which are substantially equal to the widths of the conductors and the spacing between the conductors of the flat pack. Projections 20, 22 are provided on the sides 19, 21 to polarize the support 12 when it is mounted in an electrical connector as will be explained below. The opposite face or underface of the support 12 has a trough or slot 24 extending transversely of the slots 16, 18. A locking member 26, also of nylon or other suitable plastic is adapted to be inserted into the trough 24 and has suitable recesses 27 on its longitudinal sides for the accommodation of the individual leads of the flat pack.

When the flat pack or circuit device is assembled to the support, it is merely necessary to position the chip portion 2 of the flat pack in the recess 14 and position the leads in the grooves 16, 18 on the sides of the support. These leads are then bent around the under surface of the support until the ends extend into the trough 24 at which time the locking member 26 is placed in the trough to clamp the ends of the leads against the support. Ordinarily, the clamping of the leads will be sufficient to hold the circuit device 2 against the sides of the support and in the recess 14, however, the circuit device may be bonded to the support if desired and the locking piece 26 can also be bonded to the support.

Figure 4:
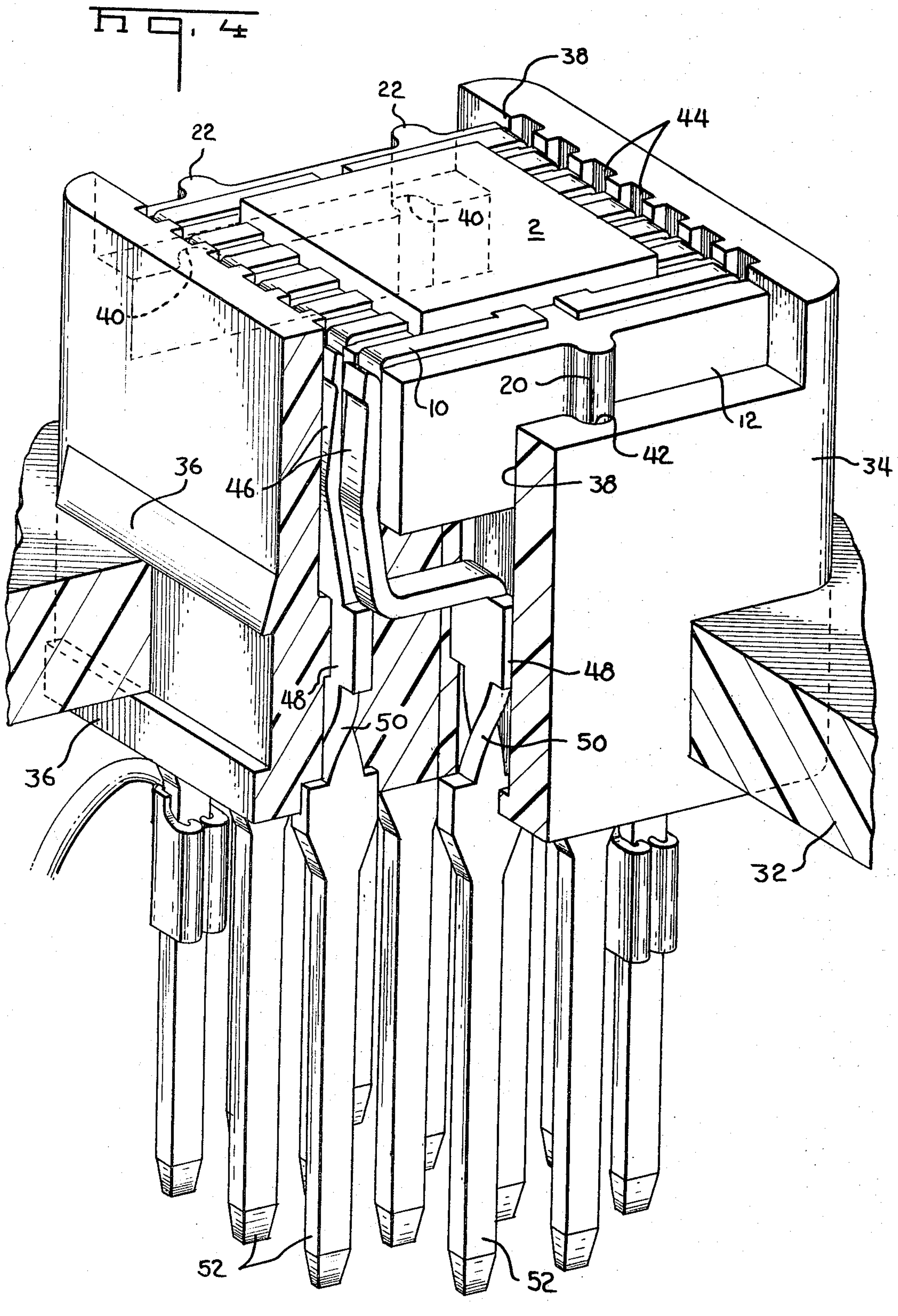
FIGURE 4 is a perspective view with parts broken away of an electrical connector intended for use with the flat pack mounting block of FIGURES 2 and 3 and showing this connector mounted on a panel-board.

After mounting of the circuit device on the support block, the support may, in turn, be mounted in a suitable electrical connector having means for making contact with the individual leads of the flat pack. One form of the connector (FIGURE 4) comprises a block 34 of suitable insulating material such as nylon having means such as spaced-apart ears 36 to lock the block in a suitable opening in the panelboard 32. The block 34 has a depression 38 on its exposed upper side dimensioned to receive the support 12. Recesses 40 are provided on the sides of this depression for the projections 20, 22 of the support block to polarize the circuit device with respect to the electrical contacts described below.

Grooves 44 are provided on the opposite sides of the depression 38 and resilient electrical contact members 46 are disposed in these grooves, the grooves being spaced apart by an amount equal to the spacing between the flat pack leads so that the contacts 46 will engage these leads when the parts are assembled. The contacts 46 have enlarged intermediate portions 48 and adjacent twisted sections 50 which extend through conforming cavities in the block to retain the individual contacts in the block as described in application Ser. No. 349,565, filed Mar. 5, 1964, now abandoned. In the disclosed embodiment, every other contact 46 is straight and the remaining contacts have a laterally extending intermediate leg. This arrangement provides room for the intermediate contact portions 48, 50 and permits close spacing of the contacts in the block. The lower ends of the contacts comprise terminal posts 52 which project normally from the block 34 and from the plane of the panelboard 32. The wiring between individual posts is achieved by connecting conductors to these terminal posts, for example, by clip-type connections.

Figures 2, 3:
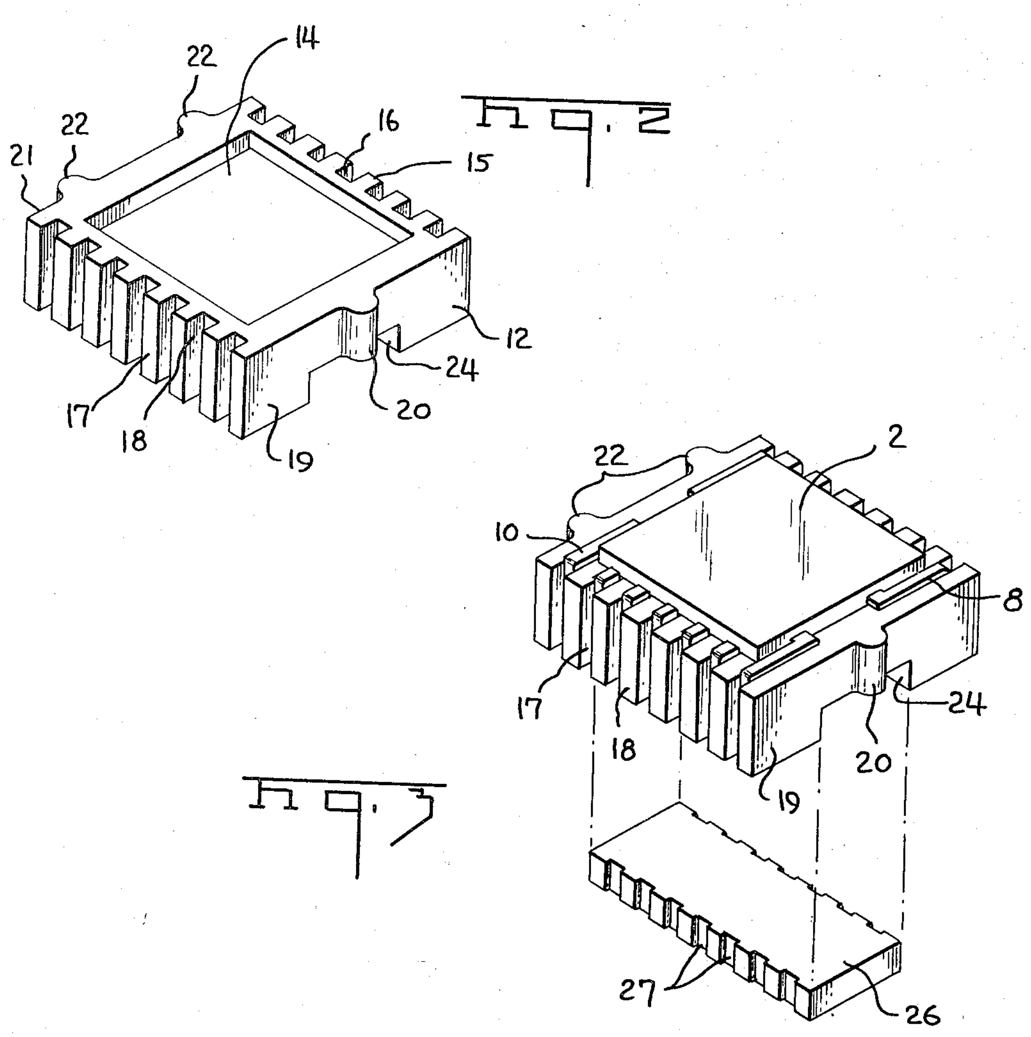
FIGURE 2 is a perspective view of a support or mounting block in accordance with the invention for the flat pack of FIGURE 1.
FIGURE 3 is a perspective view showing the flat pack mounted on the mounting block and illustrating the manner in which the flat pack leads are locked to the mounting block.

A significant advantage of the invention is that the individual circuit devices 2 can be mounted in support devices of the type shown at 12 at the time of manufacture or shortly thereafter and the mounting device will serve as a means for protecting the circuit device and its leads against damage as a result of careless or abusive handling. The leads, since they are positioned in the grooves 16, 18 cannot be carelessly bent or flexed after mounting in a manner such as might cause their being broken or damaged. The mounted flat pack, as shown in FIGURE 3, can also be directly connected by means of a connector of the type shown in FIGURE 4 to a testing apparatus for purposes of inspection. Finally, the same supporting device 12 serves as a connector part for the combination of FIGURE 4 and the circuit device is placed in the circuit by merely inserting the support in the recess 38 of the connector block 34. When the support block is so mounted in the connector block, the barriers separating the grooves 16, 18 are disposed against the barriers separating the grooves 44 so that each lead and contact 46 is isolated from adjacent leads and contacts. The support and flat pack assembly can, of course, be removed from the connector 34 for purposes of inspection or testing and the individual circuit devices on the board 32 can be replaced, if necessary, without disturbing the interconnecting wire which is achieved by the posts 52.

While the disclosed embodiment of the invention shows a type of support intended for a single circuit device, it would be within the scope of the invention to provide a relatively longer supporting block with additional grooves 16, 18 which would be capable of accommodating two or more circuit devices. Under such circumstances, a relatively larger connector 34 would also be used.

Changes in construction will occur to those skilled in the art and various apparently different modifications and embodiments may be made without departing from the scope of the invention. The matter set forth in the foregoing description and accompanying drawings is offered by way of illustration only. The actual scope of the invention is intended to be defined in the following claims when viewed in their proper perspective against the prior art.

We claim:

1. An electrical interconnection system for circuit devices comprising, a panelboard, a plurality of electrical connectors mounted on said panelboard, each of said connectors having a recess on one side thereof for reception of said circuit devices and having contacts on opposite sides of said recess, contacts extending through said connector and through the plane of said panelboard, said contacts each including post means on the opposite side of said panelboard for interconnecting conductors, said circuit devices being mounted on an insulating block with the leads extending therefrom extending around opposite sides of said block and onto the bottom face of said block, said block being mounted in said recess with said leads contacting said electrical contacts.

2. An electrical interconnection system for integrated circuit devices, said devices each having a plurality of ribbon-like leads extending therefrom, said devices each being mounted on one face of a generally rectangular insulating support with said leads extending across opposite sides of said support and being secured on the other face of said support, the portions of said leads extending across said opposite sides constituting contact surfaces, said system comprising a plurality of connectors mounted on a panelboard, each of said connectors comprising an insulation block having a recess on its exposed face for reception of one of said supports, a plurality of spaced apart electrical contacts on each side of said recess having means for making electrical contact with said contact surfaces, said contacts each extending through said block, normally of the plane of said panel, and having means on the opposite side of said panel for making electrical interconnections between and among said contacts.

3. In combination with an integrated circuit device having a plurality of leads extending from opposite sides thereof, a mounting means for said circuit device comprising an insulating support, said circuit device being disposed against one face of said support, said leads extending from said device across said one surface to opposite sides of said support thence across said opposite sides to the other face of said support, and said leads being secured against said other face, the portions of said leads extending across said opposite sides constituting contact surfaces whereby said support can be mounted in an electrical connector with said contact surfaces in electrical contact with contact members in said electrical connector.

4. A device as set forth in claim 3 wherein said support has a plurality of spaced apart grooves on said opposite sides, said leads being disposed in said grooves, said support having a trough on said other face extending transversely of said grooves, said leads extending into said trough, and means in said trough locking said leads therein.

No references cited.

ROBERT K. SCHAEFER, *Primary Examiner.*

J. R. SCOTT, *Assistant Examiner.*